(12) United States Patent
Son et al.

(10) Patent No.: US 8,903,701 B2
(45) Date of Patent: Dec. 2, 2014

(54) METHOD FOR STRUCTURING HARDWARE INFORMATION BY USING AN MOF-BASED HCML

(75) Inventors: Hyun-seung Son, Dangjin-si (KR);
Woo-yeol Kim, Suwon-si (KR);
Robertyoungchul Kim, Yongin-si (KR)

(73) Assignee: Hongik University Industry-Academic Cooperation Foundation, Seoul (KR)

( * ) Notice: Subject to any disclaimer, the term of this patent is extended or adjusted under 35 U.S.C. 154(b) by 285 days.

(21) Appl. No.: 13/446,333

(22) Filed: Apr. 13, 2012

(65) Prior Publication Data

US 2013/0117003 A1 May 9, 2013

(30) Foreign Application Priority Data

Nov. 4, 2011 (KR) .................. 10-2011-0114744

(51) Int. Cl.
*G06F 9/44* (2006.01)
*G06F 17/50* (2006.01)

(52) U.S. Cl.
CPC ........ *G06F 17/5045* (2013.01); *G06F 17/5068* (2013.01)
USPC .............................................. 703/20; 703/13

(58) Field of Classification Search
CPC ......... A63F 9/24; A63F 13/00; G05B 19/042; G06F 9/02; G06F 9/30; G06F 9/44; G06F 17/50; G06F 9/45; G06F 9/455; G06K 9/00; G10L 21/00
USPC .................. 703/13, 20, 22; 717/104; 704/270
See application file for complete search history.

(56) References Cited

U.S. PATENT DOCUMENTS

| | | | | |
|---|---|---|---|---|
| 7,823,120 | B2 * | 10/2010 | Kazakov et al. | 717/104 |
| 8,370,156 | B1 * | 2/2013 | Torgerson et al. | 704/270 |
| 8,418,125 | B2 * | 4/2013 | Hawkins et al. | 717/104 |
| 8,578,324 | B2 * | 11/2013 | Hartman et al. | 717/104 |
| 2010/0058276 | A1 * | 3/2010 | Felder et al. | 716/17 |
| 2010/0083210 | A1 * | 4/2010 | Megen et al. | 717/100 |
| 2010/0083212 | A1 * | 4/2010 | Fritzsche et al. | 717/104 |
| 2010/0138808 | A1 * | 6/2010 | Kim et al. | 717/104 |

* cited by examiner

*Primary Examiner* — Kandasamy Thangavelu
(74) *Attorney, Agent, or Firm* — Davis & Bujold, PLLC; Michael J. Bujold

(57) ABSTRACT

Provided is a method for structuring hardware information in computer system, including: modeling Target Independent Model (TIM), which is independent from a hardware; structuring hardware information based on Meta Object Facility (MOF)-Hardware Component Modeling Language (HCML); and transforming the TIM into a Target Specification Model, which depends on the hardware, based on the structured hardware information and the model transformation language, wherein the step of structuring hardware information based on Meta Object Facility (MOF)-Hardware Component Modeling Language (HCML), comprises: defining a MOF-based Hardware Component Modeling Language (HCML) meta-model; and defining a model by using a meta-model of the HCML and representing architecture information on the model.

7 Claims, 15 Drawing Sheets

HW Component Profile (b)Ubicom SX48AC

| Node Type | | Notation | Comment |
|---|---|---|---|
| Port | IN/OUT | | Component port for input and output |
| | IN | | Port receiving an input signal from another component |
| | OUT | | Port for transmitting an output signal to another component |
| HW Component Package | | | Component module for abstracting hardware |
| HW Component Resource | | | Abstracted resource for controlling hardware |
| HW Component Information | | | Class for describing information on hardware |

FIG. 13

METHOD FOR STRUCTURING HARDWARE INFORMATION BY USING AN MOF-BASED HCML

RELATED APPLICATIONS

This application claims priority to Korean Patent Application No. 10-2011-0114744, filed on Nov. 4, 2011, which is herein incorporated by reference in its entirety.

BACKGROUND

1. Field

The following description relates to Hardware Description Language (HDL) required for developing embedded software (SW); and, more particularly, to Hardware Component Modeling Language (HCML) for efficiently structuring a hardware profile as a method that simultaneously develops heterogeneous embedded systems.

2. Description of the Related Art

Meta Object Facility (MOF) is a meta object management technique suggested by the Object Management Group (OMG). The MOF is represented through Unified Modeling Language (UML) and a meta-model of the UML is defined through the MOF. The MOF has a 4-layer metadata architecture. The layers are classified into an information layer, a model layer, a meta-model layer, and a meta-meta-model layer. The information layer includes clean data, which are desired to be described. The model layer includes metadata for describing data included in the information layer. The meta-model layer includes a description for defining architecture and a meaning of the metadata, i.e., meta metadata. The meta-model is an "abstract language" for describing different types of data. That is, the meta-model is a language without a specific grammar or mark. The meta meta-model layer includes description of the meaning and the architecture of the meta metadata. The meta meta-model layer is an "abstract language" for defining different types of metadata.

FIG. 1 shows a typical 4-layer meta modeling framework.

The RecordTypes meta-model may describe a lot of record types in a model level in the same manner as that a StockQuote type describes a lot of StockQuote instances in an information level in FIG. 1. Likewise, the meta-meta-model level may describe a lot of different meta-models n the meta model.

The typical 4-layer metadata architecture has many advantages in comparison with a simple modeling method. If the framework is well defined and designed, it is possible to support any types of model expected to be embodied and a modeling paradigm, allow different types of related metadata, allow an increasingly added meta-model and a new type of metadata, and support an exchange between a group using the meta-meta-model such as the meta-metadata (meta-model) and a predetermined metadata(model). In conclusion, since the meta-models may be standardized through the MOF, transformation between diverse models is possible.

Hardware Description Language (HDL) such as Verilog and VHSIC Hardware Description Language (VHDL) may be efficiently used for designing and simulating hardware but may not be properly applied to a complicated data process function or a system level designing. In particular, when a processor core such as System-on-a-Chip (SoC) is embedded and a very complicated function is embodied as a semiconductor chip, it is difficult to design only with a conventional hardware description language.

VHSIC Hardware Description Language (VHDL) is a hardware description language used for design automation of a digital circuit. The VHDL allows a broad range of design. The VHDL includes a behavioral description of a system level at an upper level and a gate level at a lower level. That is, the VHDL allows behavioral description, Register Transfer Level (RTL) description and gate level description. However, since the language for describing a VHDL hardware chip is complicated itself, it requires a lot of time and efforts for a general software developer to understand and easily use the language. The VHDL has an architecture, which is difficult to be understood. Since the object of the VHDL is to design a chip, there is a problem that a hardware control method cannot be described.

Since embedded software (SW) is subordinated to hardware, there is a problem that redesigning is needed whenever hardware is changed. Model Driven Development (MDD) is applied in existing studies for improving reusability of the embedded software. The MDD is a technique for developing a generally reusable hardware independent model and automatically creating the model as a hardware specification model based on pre-defined hardware profile information.

A hardware profile stores information required for developing the embedded software. The hardware profile should include information for connecting each of hardware components as well as detailed information on which hardware device a memory address and a CPU pin is connectable to, and which register any value should be input into in order to control each of hardware. Therefore, the hardware profile plays a very important role in developing MDD-based embedded software. A modeling/specification language for efficiently representing and defining hardware profile information is not developed yet. Accordingly, development of a hardware profile modeling/specification language is required prior to efficient reuse of the embedded software.

Unified Modeling Language (UML) as an integrated modeling language is widely used for specification and designing of the embedded software. Accordingly, if hardware profile information is defined using UML techniques, a hardware independent model developed using the UML may be transformed into a hardware specification model more efficiently.

Since a methodology for developing Model Driven Development (MDD)-based software allows independent software development in hardware change, studies for applying the methodology to embedded software (SW) development has been actively progressed. Information of hardware to be used is required to maintain a profile format in order to develop MDD-based embedded software. A language for efficiently defining a hardware profile is also needed.

Conventionally, there is a Hardware Description Language (HDL) including Verilog or VHSIC Hardware Description Language (VHDL) as a language for defining a hardware profile. The Hardware Description Language (HDL) may be efficiently used for designing and simulating hardware but may not be properly applied to a complicated data process function or a system level designing. In particular, when a processor core such as System-on-a-Chip (SoC) is embedded and a very complicated function is embodied as a semiconductor chip, it is difficult to design only with a conventional hardware description language. Since a language for describing a VHDL hardware chip is complicated itself, it requires a lot of time and efforts for a general software developer to understand and easily use the language. The VHDL has an architecture, which is difficult to be understood. Since the object of the VHDL is to design a chip, there is a problem that a hardware control method cannot be described.

SUMMARY

To achieve the embodiment of the present invention, a Hardware Component Modeling Language (HCML) as a modeling language for specifying a hardware profile used in an MDD-based model transformation is provided.

According to the present invention, a method for structuring hardware information in a computer system, the method may comprises: modeling Target Independent Model (TIM), which is independent from a hardware; structuring hardware information based on Meta Object Facility (MOF)-Hardware Component Modeling Language (HCML); and transforming the TIM into a Target Specification Model, which depends on the hardware, based on the structured hardware information and the model transformation language, wherein the step of structuring hardware information based on Meta Object Facility (MOF)-Hardware Component Modeling Language (HCML), comprises: defining a MOF-based Hardware Component Modeling Language (HCML) meta-model; and defining a model by using a meta-model of the HCML and representing architecture information on the model.

As one aspect of the present invention, the HCML meta-model comprises: a hardware component package (HCP) for abstracting a hardware component; a Port for connecting this first HCP to another (second) HCP to facilitating either inputting or outputting a signal; a hardware component information (HCI) containing hardware information; a hardware component resource (HCR) including Class and Element Properties for mapping the HCI, the hardware component resource being an abstracted model to control the hardware; and a Connector for connecting the Port to the Port or connecting the Port to the HCR.

As one aspect of the present invention, the HCI is the same class as a class diagram and stores hardware control register information in a property and API information for control in a Method.

As one aspect of the present invention, the HCR as a module that abstracts a unique function of the hardware may define a role and a function of the hardware module and one HCR includes one function.

As one aspect of the present invention, the Port may be able to set three output directions of in, out, and in/out and the output directions are set by input/output port register control.

As one aspect of the present invention, the HCI has a connotation association with the HCR and has an architecture that is shared by another HCR.

As one aspect of the present invention, the step of defining a model by using a meta-model of the HCML and representing architecture information on the model, comprises:

defining a model by using the HCML meta-model; and defining an Information layer by representing architecture information on the model by describing a mapping association of the defined model and the HCML meta-model as an eXtensible Markup Language (XML).

Hardware information to be used is required to maintain a profile format to develop MDD-based embedded software (SW). Herein, Hardware Component Modeling Language (HCML) as a modeling language for efficiently specifying the hardware profile used in a MDD-based model transformation is suggested. The HCML represents graphic-based hardware information using a class diagram and a component diagram of a Unified Modeling Language (UML). A hardware component is to abstract an actual hardware. A function of the component is represented by improving the class of the class diagram of the UML. Also, since the HCML is developed based on Meta Object Facility (MOF), it is interoperable with a UML meta-model as well as ATLAS Transformation Language (ATL) organically. The HCML may be properly used for developing a firmware level software that a platform or an Operating System (OS) is not built. The hardware information structuring method may be applied to automatic transformation of a target specification model and a target independent model in an MDD-based heterogeneous Embedded development process.

An additional features and advantages of the present invention will be provided in a following description and be partially cleared through the above description or understood through the realization of the present invention. The object and other advantages of the present invention will be embodied by the structure indicated in claims as well as the following description and accompanying drawings.

BRIEF DESCRIPTION OF THE DRAWINGS

FIG. 13 shows a notation of the HCML.

DETAILED DESCRIPTION

Hereinafter, preferred embodiments will be described with reference to accompanying drawings.

Figure 1:
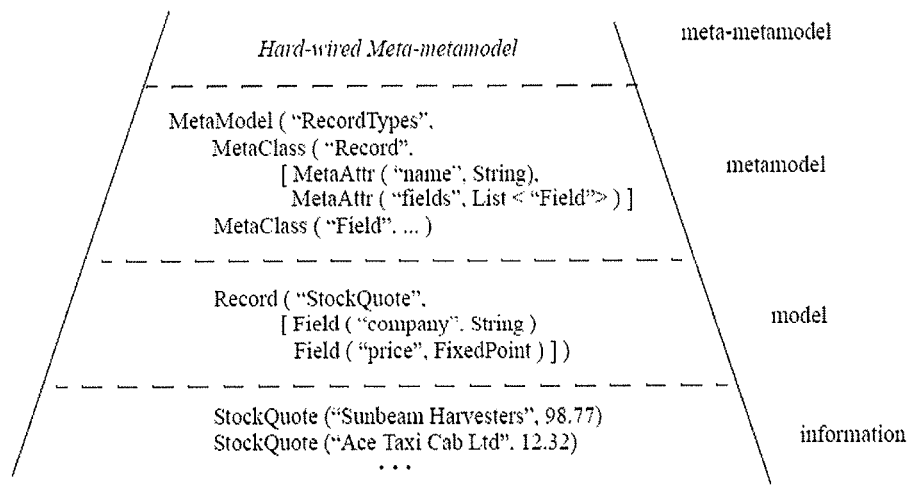
FIG. 1 shows a typical 4-layer meta modeling framework.
Figure 2:
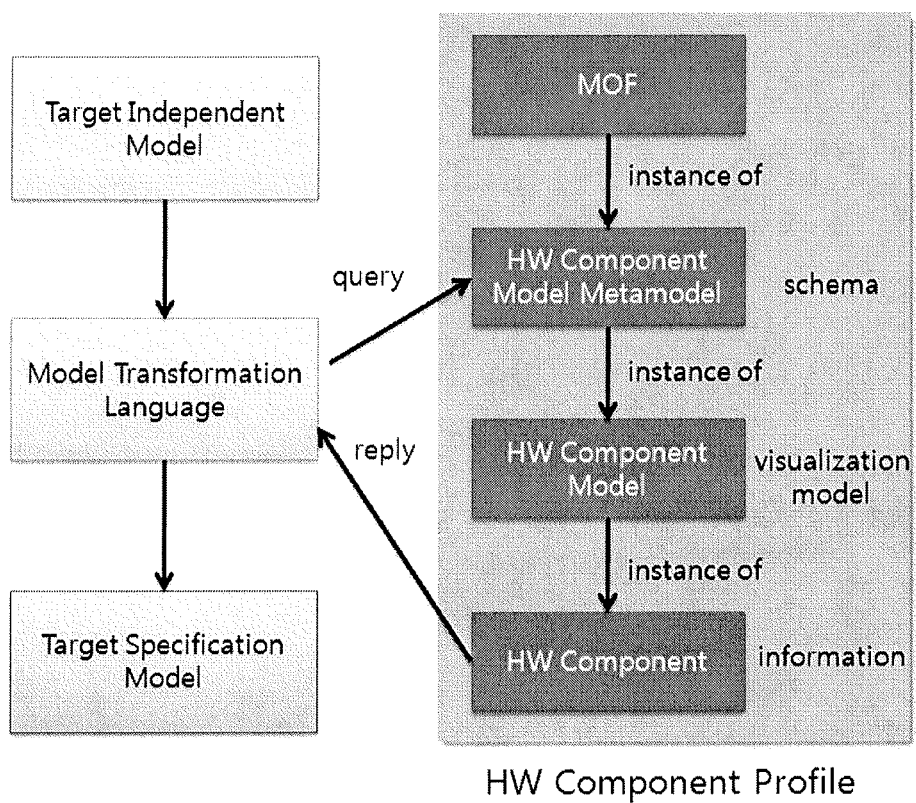
FIG. 2 shows a 4-layer architecture of a HW Component Profile.

FIG. 2 shows a 4-layer architecture of a hardware component profile. FIG. 2 is a schematic diagram showing how a hardware component profile designed as the HCML is applied to a model transformation procedure of the conventional MDD development method.

As shown in FIG. 2, the MDD-based model transformation includes a process of modeling Target Independent Model (TIM) independently included in the hardware, a process of structuring hardware information by using Meta Object Facility (MOF)-based Hardware Component Modeling Language (HCML), a process of transforming the TIM into a Target Specification Model, which is dependently included in the hardware, based on the structured hardware information and the model transformation language. The process of structuring the hardware information includes a process of defining the meta-model of the MOF-based Hardware Component Modeling Language (HCML), and a process of defining a model by using the HCML meta-model and representing architecture information on the model.

Since the HCML meta-model is designed based on the MOF, extension and transformation with an existing UML diagram are easily performed.

A model transformation language is required for transforming the Target Independent Model (TIM), which is independent from the hardware, into the Target Specification Model (TSM), which is dependent on the hardware. Since the model transformation language helps transformation between models but does not provide hardware information, a hardware profile is needed. If the hardware (HW) component profile stores only data, it may be difficult to be used in the model transformation language. Accordingly, the hardware information is structured by using the MOF-based HCML.

Figure 3:
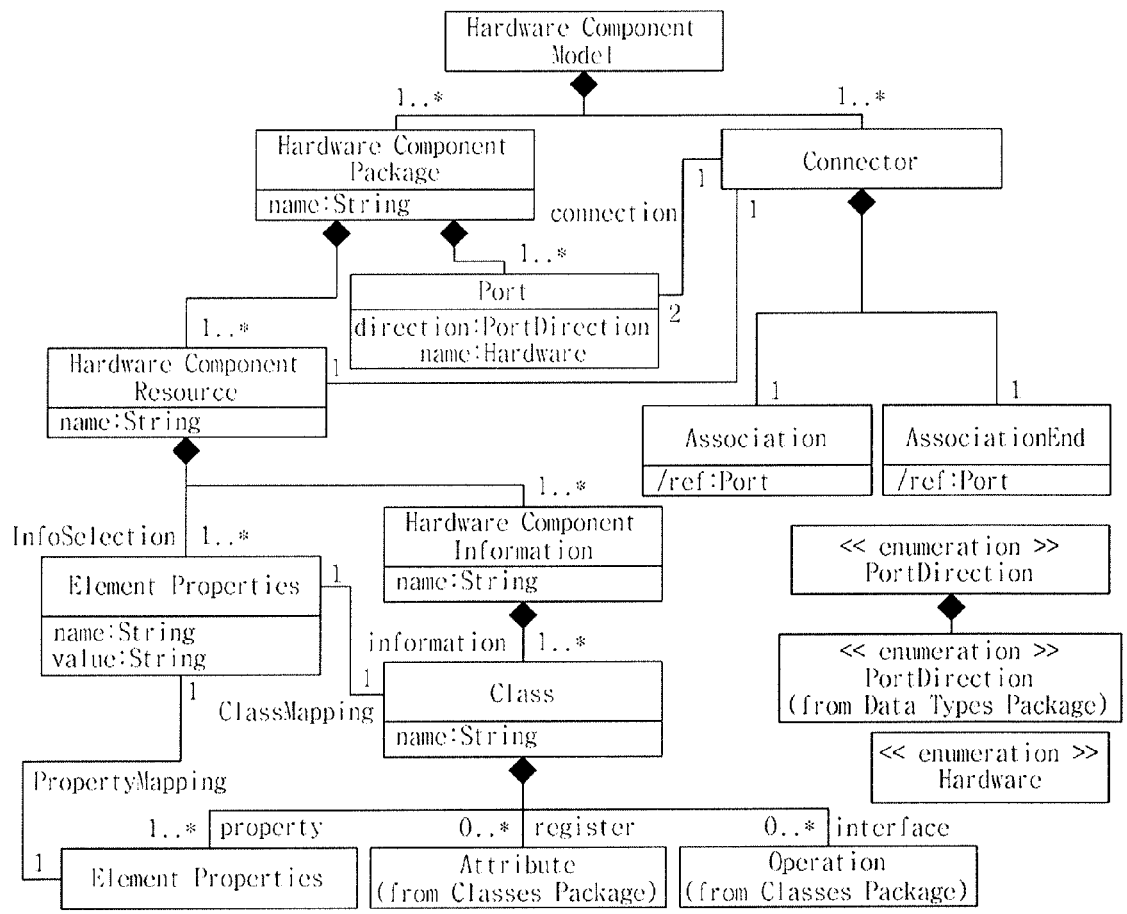
FIG. 3 shows a MOF-based HW Component Profile Meta-model.

FIG. 3 shows a MOF-based hardware component profile meta-model.

The HCML meta-model as shown in FIG. 3 is preferentially required for modeling the hardware information. Main constituent elements of the HCML are HW Component Package (HCP), a Connector, HW Component Resource (HCR), a Port, and HW Component Information (HCI). One hardware component is abstracted to be the HCP, which is connected by the Connector. The Connector connects the Ports or connects the Port to the HCR.

The Ports are connected to be mapped at a ratio of 1 to 1. The Port and the HCR are connected at a ratio of 1 to many. The HCR that a hardware resource is abstracted includes a class and element properties for mapping the HCI. The HCR represents how the hardware resource is connected to the Port in the HCP.

The Port is used for connecting the first HCP to another (second) HCP. PortDirection as an attribute value is classified into three types of in, out, and in/out. The HCI is a model containing hardware information and includes register information for controlling hardware and an interface function for operating the hardware. The HCI and the HCR have a generalization relation. Therefore, the HCR is a model that abstracts the HCIs.

>>Graphical Notation of HCML

A feature of each notation shown in FIG. 13 will be described hereafter. A Port is a device for connection with an external HCP, which means a hardware module. The HCR is an abstracted model of the HCI and represents a hardware resource. The HCI includes register information for controlling a hardware and an API for driving. A control method is described in a code format.

In each constituent element, an output direction of the port may be set as three levels of in, out, and in out. The setting the output direction is applied to control an input/output port register in Micro Controller Unit (MCU) to provide automatic setting information. Also, the port connects the HCP to the HCP, and connects the HCP to the HCR. The HCP is a component module that the hardware is abstracted and includes an HCR and a Port. The Port is in charge of input/output with an outside and the HCR defines a role and a function of the hardware module. The HCR is a module that a unique function of the hardware is abstracted. One HCR includes one function. The HCR is an abstracted resource for controlling a hardware and includes HCIs. The HCI is basically like a class in a class diagram. Hardware control register information is stored in an attribute and API information for control is stored in a method. An abstract level may be divided using hierarchical structure.

The HCML provides a means and a method for building a hardware profile. A mapping association among the meta-model, the model, and the information is provided using a 4-layer architecture of the MOF. The meta-model uses a notation and information for defining a model. The meta-model is not at a level that a user can see visibly but represents architecture information on the model. The model is at a level that the user can use through a graphic notation, and is mapped with the information at a ratio of 1 to 1 (1:1). There is an advantage that the meta-model may be used as the information by using XML but it is also possible to find the information through XML Description such as XPath.

Figure 4:
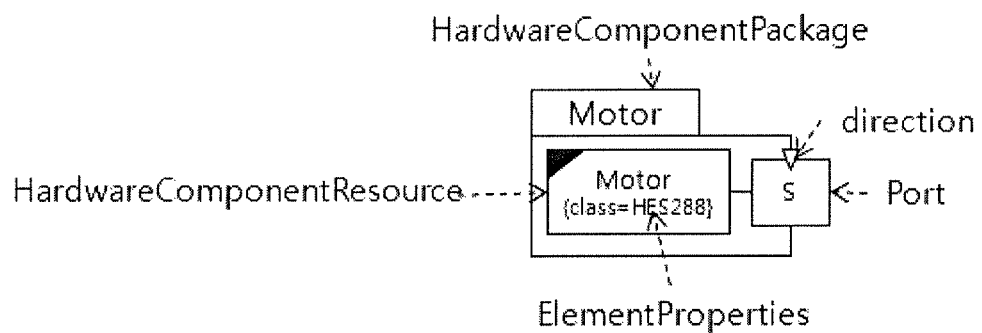
FIG. 4 shows an association between HCP and a meta-model.

FIG. 4 shows an association between the HCP and the meta-model and represents the HCP at a model level. FIG. 4 shows mapping with the meta-model such as HCP, HCR, Port, and ElementProperties.

An information layer may be defined through mapping association of the meta-model and the model and it is described as the XML as shown in [Table 1] below. The information described as the XML confirms that the architecture used in the meta-model is also used without change.

TABLE 1

<HardwareComponentPackage>
<HardwareComponetResource>
<ElementProperties/>
</HardwareComponetResource>
<Port />
</HardwareComponentPackage>

Figure 5:
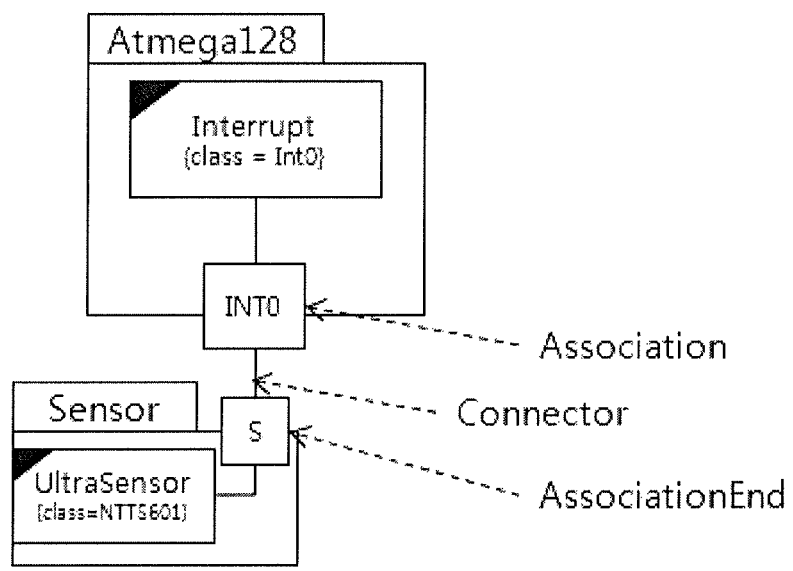
FIG. 5 shows an association between HCP and HCP.

FIG. 5 shows an association of the HCP and the HCP.

As shown in FIG. 5, the HCP is connected to the same type of HCP through the Port. A connection line is a Connector and a related Port is set as Association and AssociationEnd.

The following [Table 2] is a table representing the information of the Connector as an XML. The Association and the AssociationEnd may be defined using the Connector.

TABLE 2

<Connector>
<Association />
<AssociationEnd />
</Connector>

Figure 6:
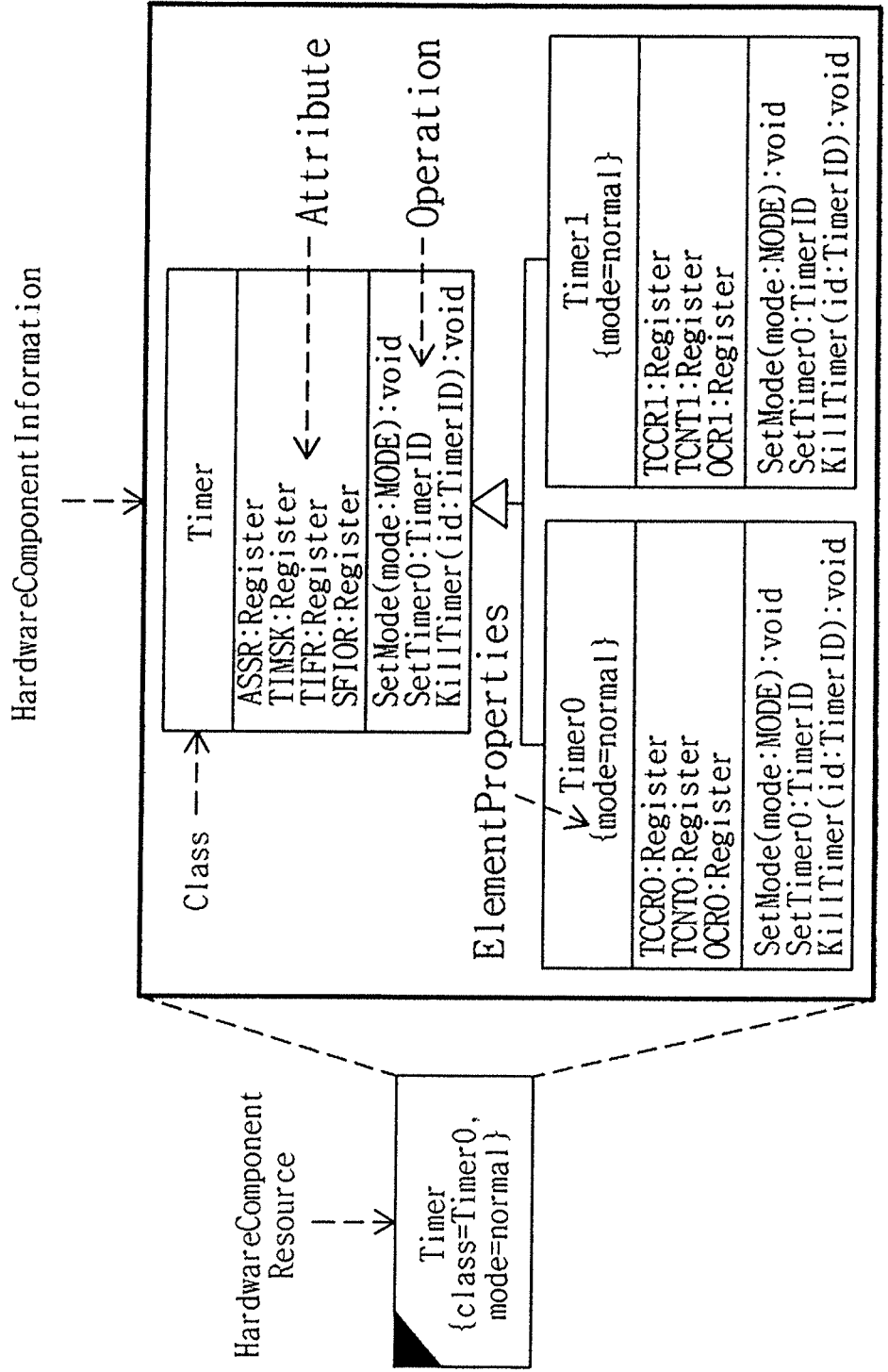
FIG. 6 shows an association between HCR and HCI.

FIG. 6 shows an association of the HCR and the HCI.

The HCR is defined inside the HCP. One HCR includes one HCI and it is represented as shown in FIG. 6. Timer HCR is defined as Timer class, Timer0 class, and Timer1 class. Register information and interface information may be put in the class. The HCI includes Classes and the Class includes Attribute, Operation, and Element Properties. It is important in the HCI that the hardware control register related to the hardware resource is managed in a class diagram format of the UML. Accordingly, diverse hardware control registers may be represented.

It seems that the HCI is used as a lower structure of the HCR but the HCR and the HCI are individually maintained.

The class defined in the Element Properties and the class of the HCI are mapped in the HCR. Accordingly, the individually separated HCR and HCI are connected. The separation is required for one resource to use the similar type of HCI. The following [Table 3] represents information of the HCR and the HCI as an XML.

TABLE 3

<HardwareComponentResource>
<ElementProperties />
</HardwareComponetResource>
<HardwareComponentInformation>
<class>
<Attribute />
<Operation />
</class>
<Connector>
<Association />
<AssociationEnd />
</Connector>
</HardwareComponentInformation>

Figure 7:
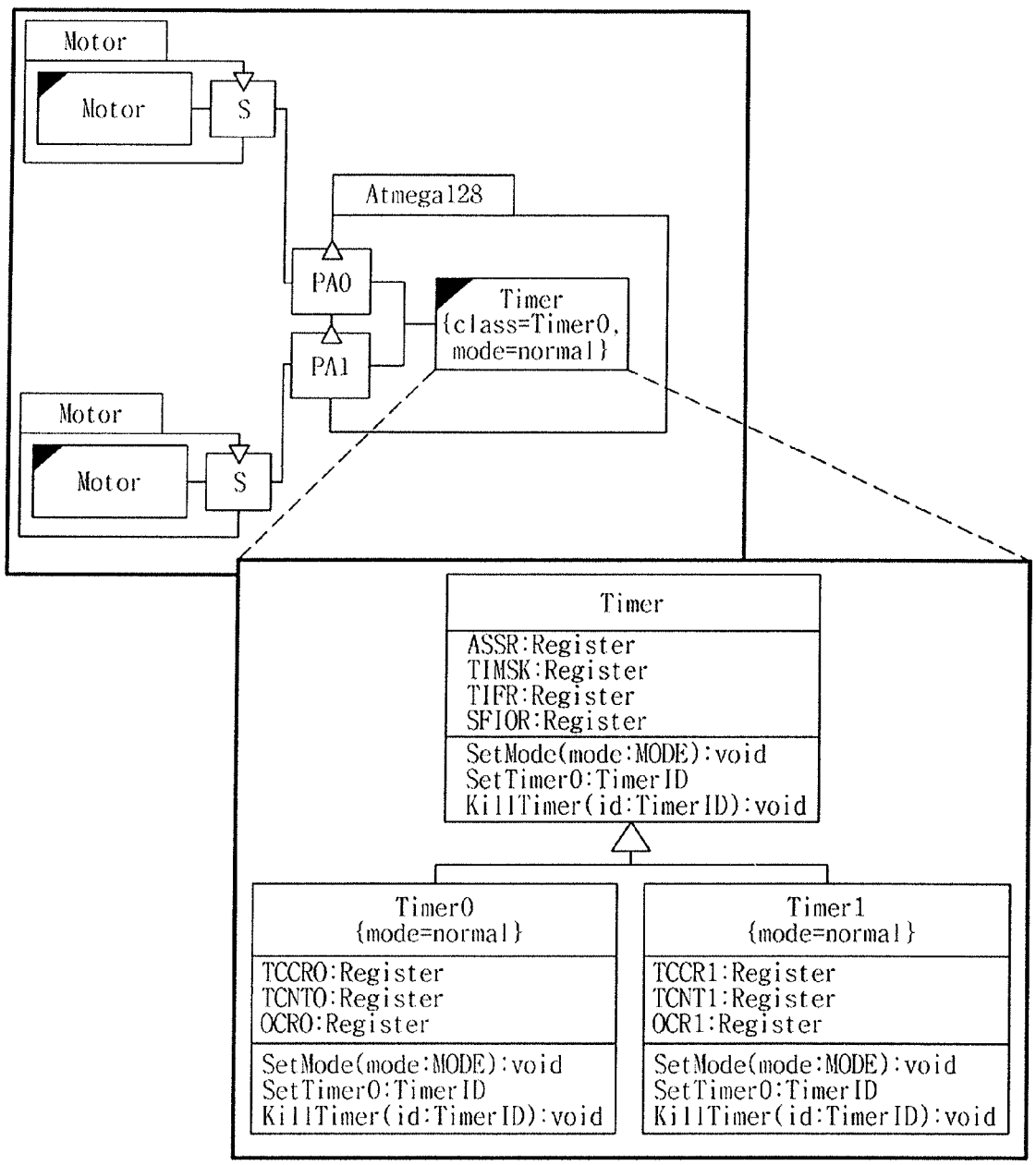
FIG. 7 shows an example of modeling using HCML.

FIG. 7 shows an example of modeling using the HCML.

As shown in FIG. 7, Motor and Atmega128 are used for the HCP. Motor HCR and an input port are connected to the Motor HCP. In the Atmega128 HCR, output ports PA0 and PA1 use Timer HCR. Also, modeling the Timer HCR into the HCI including Timer, Timer0, and Timer1 may be performed. The HCR and the HCI have a connontation association and an architecture that one HCI may be shared by another HCR. It is a method for reusing a resource on the HCI.

Since the HCM stores hardware control information and configuration information, an initializing code may be automatically created at the time of creating a code. Since the hardware is abstracted based on a component, it is supported to connect a heterogeneous hardware through a Port.

Hereinafter, as an example of the present invention, a HW Component Profile is designed and built in a heterogeneous sensor robot system including a hexapod robot and Javeline based on the HCML. It will be described hereinafter.

>>Hardware Configuration Information

Figure 8A:
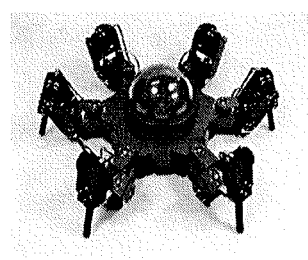
FIGS. 8A and 8B respective show photographs of a hexapod sensor robot and a Javeline.
Figure 8B:
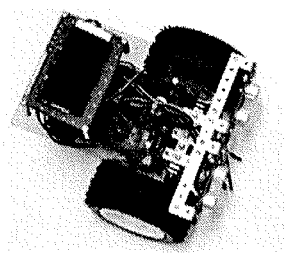

FIG. 8A is a photograph showing the hexapod sensor robot and FIG. 8B is a photograph showing the Javelin.

In FIG. 8A shows the hexapod sensor robot used as an application example and FIG. 8B shows the Javeline, The hexapod robot is a multi-articulated robot using 18 servo motors and is designed to be appropriate for moving in rough terrain such as mountainous terrain rather than flat terrain. On the other hand, the javeline may move only in the flat terrain but has a feature that quickly and easily moves by using wheels.

The following [Table 4] shows a hardware configuration of the hexapod robot.

As shown in [Table 4], the hardware configuration of the hexapod robot uses three joints per one leg and Atmega128 MCU, and includes total 18 servo motors. Also, a Bluetooth for a real-time control is used. An ultrasonic sensor is used to detect a front obstacle. The MCU used in the hexapod-type multi-articulated robot is an 8 bit processor with a very small size. Since the hexapod robot hardware cannot be developed with an object-oriented language such as C++ and Java, it is developed with a C language. The Javeline includes Ubicom SX48AC, two motors, and two sensors. The Javeline is a wheel-type robot and uses fewer motors than the hexapod robot. Since a JAVA virtual machine as a hardware is embedded into the MCU, JAVA language may be executed.

TABLE 4

| Division | (a) hexapodrobot | (b) Javeline |
|---|---|---|
| Microcontroller | Atmega 128 16 MHz | Ubicom SX48AC 20 MHz |
| RAM | 4 KByte | 32 KByte |
| EEPROM | 128 KByte | 32 KByte |
| Sensor | 1 | 2 |
| Communication | Bluetooth | None |
| Motors | 18 | 2 |
| Languages | C | Java |

>>Modeling Heterogeneous HW Component Profile Using HCML

Figure 9:
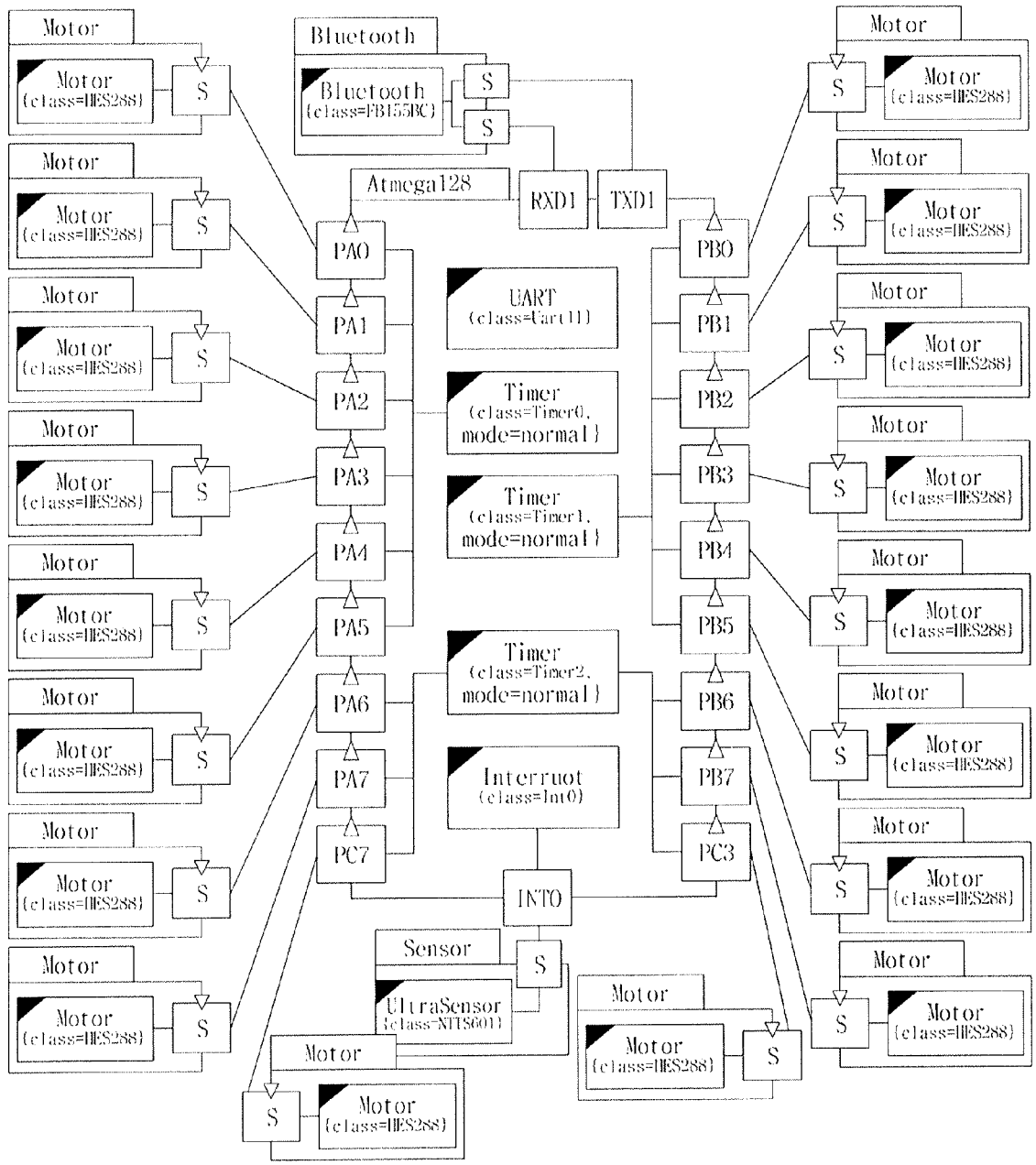
FIG. 9 is an example of modeling the hexapod robot using an HCML notation.

FIG. 9 shows an example of modeling the hexapod robot using the HCML notation.

As shown in FIG. 9, the hexapod-type multi-articulated robot uses 18 ports among PA0~PC7 ports by using the Atmega128 and transmits a control signal to each motor by using Timer0, Timer1, and Timer2. Also, the hardware is controlled by connecting UART1 to Bluetooth and the ultrasonic sensor to Interrupt0. It is possible to easily configure hardware configuration information and hardware device information through HCM modeling.

Figure 10:
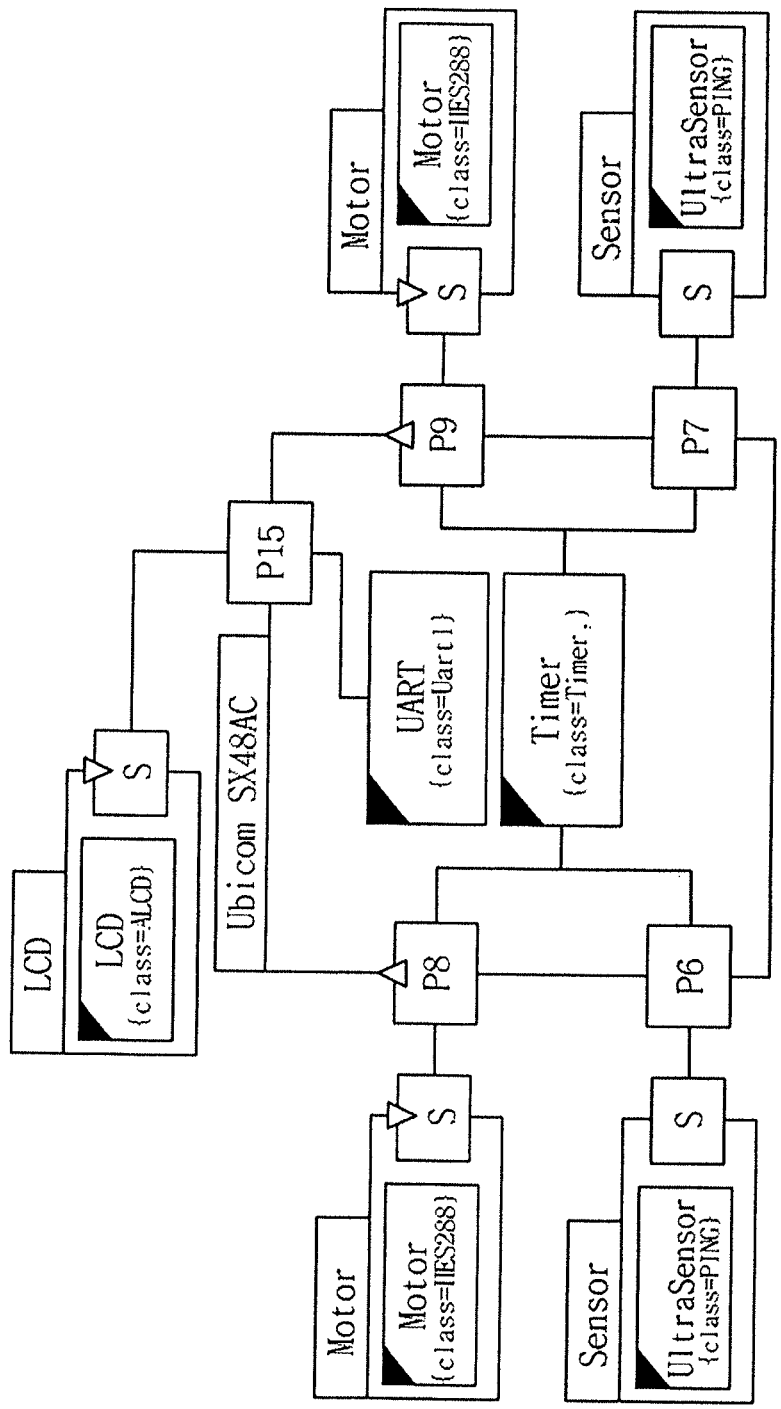
FIG. 10 is an example of modeling the Javeline using the HCML notation.

FIG. 10 shows an example of modeling Javeline using the HCML notation.

As shown in FIG. 10, since the Javeline uses wheels as a transportation, the Javeline may be moved by two motors and modeling itself is simple. Ubicom SX48AC used in the Javelin includes total 16 pins and uses P6 to P9, and P15 among the pins. The Ubicom SX48AC uses P6 and P7 to control the ultrasonic sensor, P8 and P9 to control the servo motor, and P15 to control Liquid Crystal Display (LCD). The Javeline controls the hardware by using UART and Timer among MCU functions for control.

The following [Table 5] is a Comparison Table showing the Port of the Javeline and the hexapod robot of the hardware profile.

When the modeling information of the Javeline and the hexapod robot is stored, it is represented by an XML as shown in [Table 6]. [Table 5] describes only a content, which relates to the Port in the entire codes. The Port includes a direction, a name and an identification (ID). Three types of information are stored in each of the connected Port. The hexapod robot uses 21 Ports and the Javeline uses 5 Ports.

TABLE 5

(a) Hexapod Robot

<Port direction="out" name="PA0" id="PORT1" />
<Port direction="out" name="PA1" id="PORT2" />
<Port direction="out" name="PA2" id="PORT3" />
<Port direction="out" name="PA3" id="PORT4" />
<Port direction="out" name="PA4" id=" PORT5" />
<Port direction="out" name="PA5" id="PORT6" />
<Port direction="out" name="PA6" id="PORT7" />
<Port direction="out" name="PA7" id="PORT8" />
<Port direction="out" name="PB0" id="PORT9" />
<Port direction="out" name="PB1" id="PORT10" />
<Port direction="out" name="PB2" id="PORT11" />
<Port direction="out" name="PB3" id="PORT12" />
<Port direction="out" name="PB4" id="PORT13" />
<Port direction="out" name="PB5" id="PORT14" />
<Port direction="out" name="PB6" id="PORT15" />
<Port direction="out" name="PB7" id="PORT16" />
<Port direction="out" name="PC3" id="PORT17"/>
<Port direction="out" name="PC7" id="PORT18" />
<Port direction="in out" name="INT0" id="PORT19" />
<Port direction="in out" name="RXD1" id="PORT20" />
<Port direction="in out" name="TXD1" id="PORT21" />

(b) Javeline

<Port direction="in out" name="P6" id="PORT1" />
<Port direction="in out" name="P7" id="PORT2" />

TABLE 5-continued

```
<Port direction="out" name="P8"
id="PORT3" />
<Port direction="out" name="P9"
id="PORT4" />
<Port direction="in out"
name="P15" id="PORT5" />
```

FIG. 11 is an example of modeling a Timer function among the heterogeneous MCU.

Figure 11A:
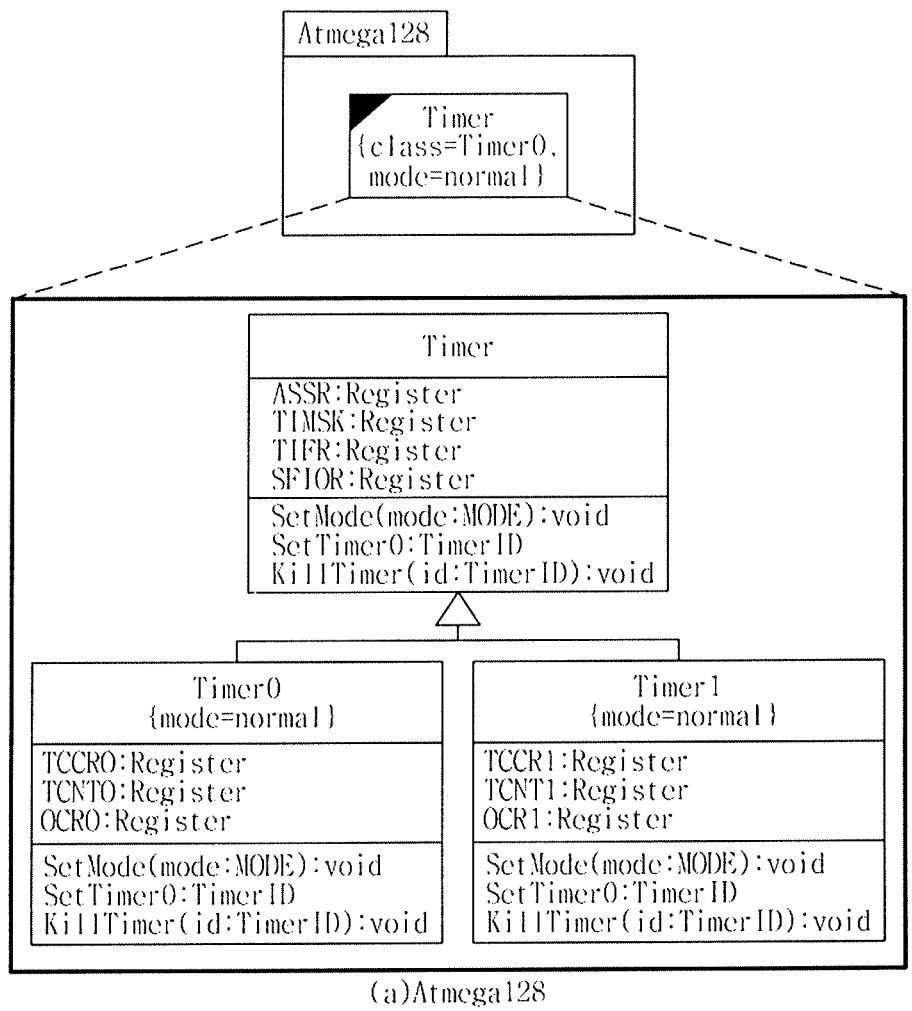
FIGS. 11A and 11B are examples of modeling a timer function in functions of a heterogeneous MCU.
Figure 11B:
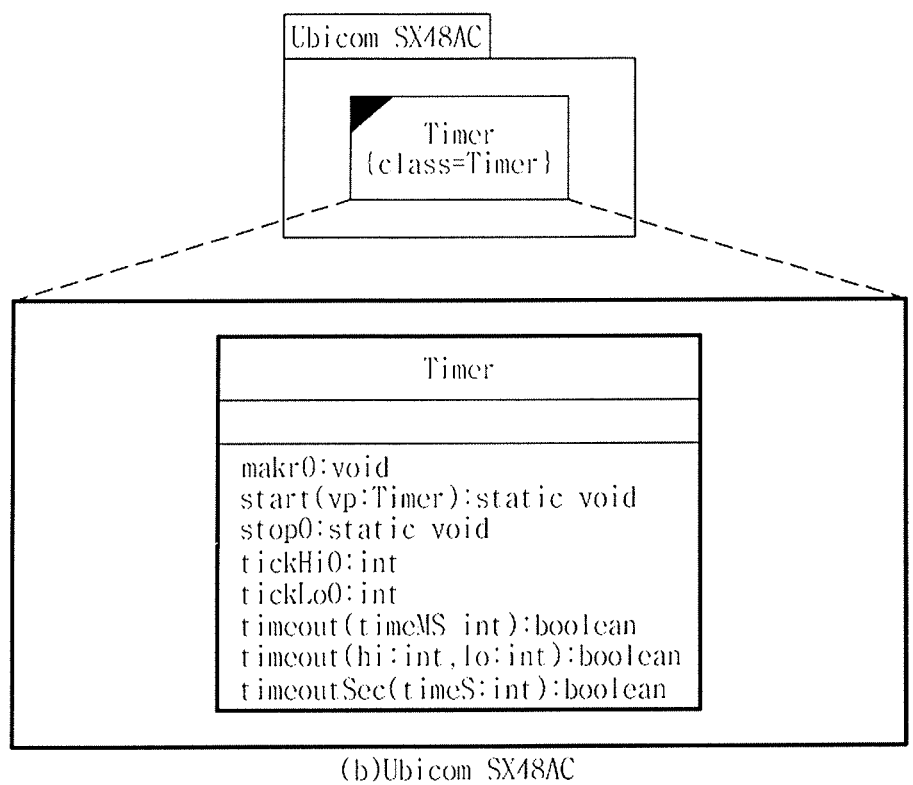

In the HCML, the HCR is a main function of the HCP. The NCR includes functions provided by the hardware. A heterogeneous SUGV including the hexapodrobot and the Javeline may be represented by the HCR by using the HCML. As shown in FIG. 11A, the Atmega128 is defined by two Timers, and in FIG. 11B, the Ubicom SX48AC is defined by one Timer. The Atmega128 may access the hardware register directly. On the other hand, since the Ubicom SX48AC passes through a JAVA interpreter, the Ubicom SX48AC cannot access the hardware register but is controlled through the API.

Figure 12A:
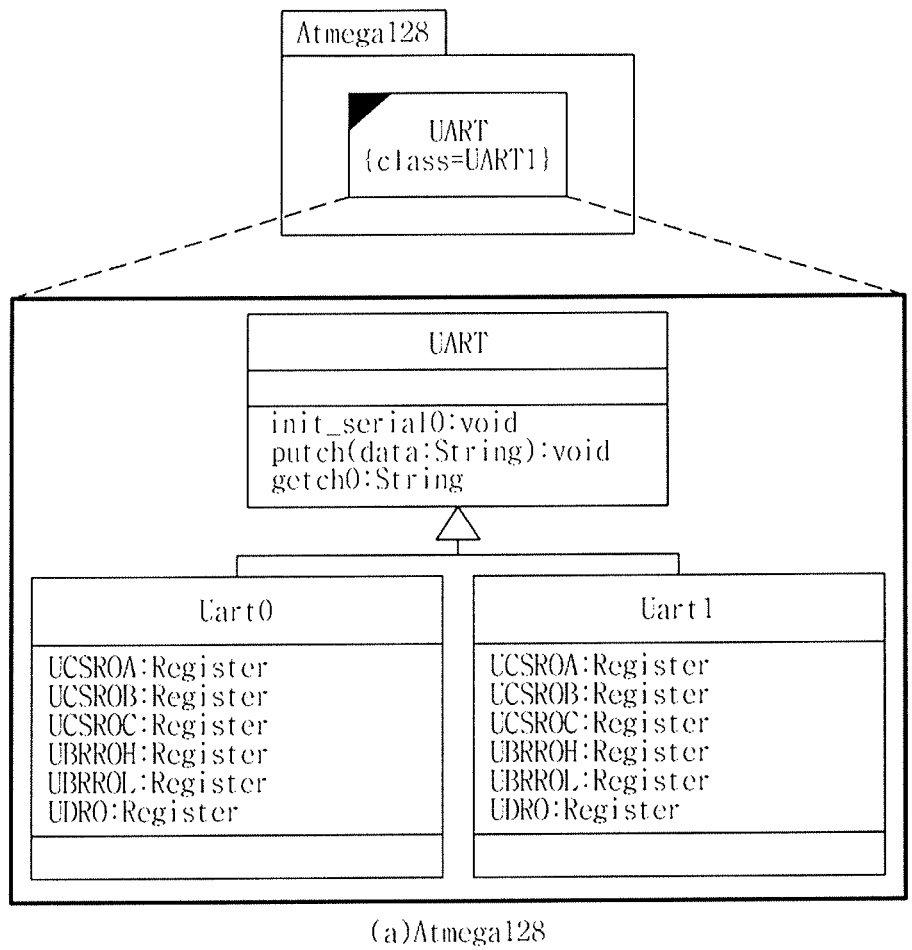
FIG. 12 shows a UART as an HCR in the functions of the heterogeneous MCU.
Figure 12B:
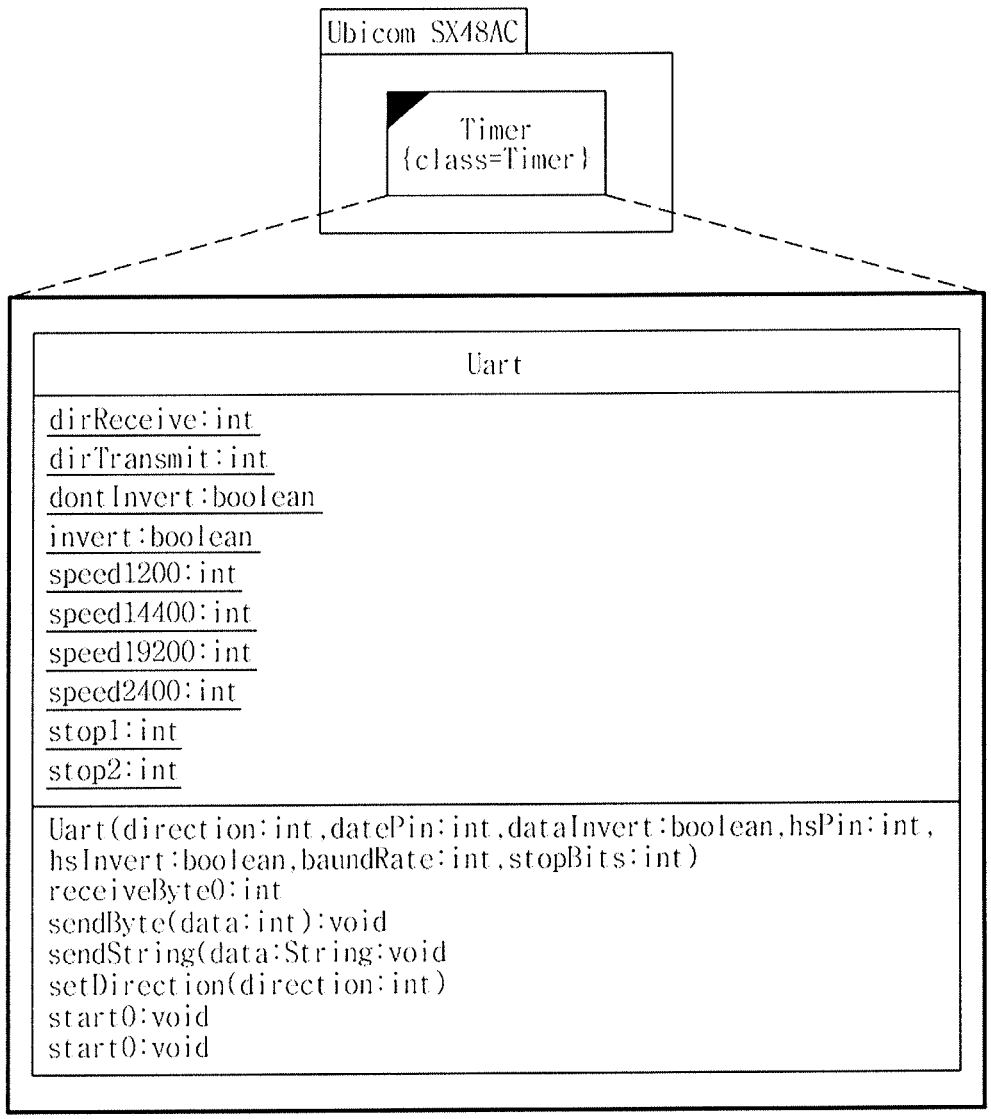

FIGS. 12A and 12B show the UART as the HCR in the functions of the heterogeneous MCU.

As shown in FIG. 12A, the Atmega128 includes two Uarts, and as shown in FIG. 12B, the Ubicom SX48AC includes 1 Uart. The Atmega128 may access the register but the Ubicom SX48AC cannot access the register like the Timer. Therefore, the Ubicom SX48AC may control the hardware only through the API.

As described above, the HW Component Profile is designed and built in the heterogeneous sensor robot systems including the hexapodrobot and the Javeline by using the HCML. As a result, information on the hardware may be easily built in comparison with the existing hardware designing method and the API specification of the software control becomes possible.

As described above, the HCML that may efficiently define the hardware profile for developing the MDD-based embedded software is suggested. The HCML efficiently defines and represents the graphic-based hardware profile by using the Component diagram and the Class diagram of Unified Modeling Language (UML). Also, since the HCML is designed based on Meta Object Facility (MOF), the HCML may be organically compatible with the model transformation language such as ATLAS Transformation Language (ATL) and is interoperable with the UML meta-model. In addition, the HCML is appropriate for software development of the firmware level that the platform and the OS are not built. It is expected that the HCML may be applied to the automatic transformation of the target specification model and the target independent model in the process of the MDD-based heterogeneous embedded development.

While the present invention has been described with respect to the specific embodiments, the scope of the present invention is not limited thereto. It will be apparent to those skilled in the art that various changes and modifications may be made without departing from the spirit and scope of the invention as defined in the following claims and all or the part of the exemplary embodiments may be selectively combined and configured to realize diverse modifications. Therefore, the real scope of the technological right will be limited by the technological concept of the accompanying claims.

What is claimed is:

1. A method for structuring hardware information in a computer system, the method comprising the steps of:
   receiving a Target Independent Model (TIM) which is independent from a hardware;
   structuring hardware information based on Meta Object Facility (MOF)-Hardware Component Modeling Language (HCML); and
   transforming the Target Independent Model (TIM) into a Target Specification Model, which depends on the hardware, using the structured hardware information and a model transformation language,
   wherein the step of structuring hardware information based on Meta Object Facility (MOF)-Hardware Component Modeling Language (HCML), comprises:
   defining a MOF-based Hardware Component Modeling Language (HCML) meta-model; and
   defining a model by using the meta-model of the Hardware Component Modeling Language (HCML) and representing architecture information on the model.

2. The method of claim 1, wherein the Hardware Component Modeling Language (HCML) meta-model comprises:
   a first hardware component package (HCP) for abstracting a hardware component;
   a first Port for connecting the first hardware component package (HCP) to a second hardware component package (HCP) to facilitate either inputting or outputting a signal;
   a hardware component information (HCI) containing hardware information;
   a hardware component resource (HCR) including Class and Element Properties for mapping the hardware component information (HCI), and the hardware component resource being an abstracted model to control the hardware; and
   a Connector for connecting the first Port to a second Port or connecting the first Port to the hardware component resource (HCR).

3. The method of claim 2, wherein the hardware component information (HCI) is the same class as a class diagram and stores hardware control register information in a property and API information for control in a Method.

4. The method of claim 2, wherein
   the hardware component resource (HCR) is a module that abstracts a unique function of the hardware and defines a role and a function of a hardware module which comprises one of the first and the second hardware component packages (HCP), and
   one hardware component resource (HCR) includes one function.

5. The method of claim 2, wherein the first Port is able to set three output directions of in, out, and in/out and the output directions are set by input/output port register control.

6. The method of claim 2, wherein the hardware component information (HCI) has a connotation association with the hardware component resource (HCR) and has an architecture that is shared by another hardware component resource (HCR).

7. The method of claim 1, wherein the step of defining a model by using a meta-model of the Hardware Component Modeling Language (HCML) and representing architecture information on the model, comprises:
   defining a model by using the Hardware Component Modeling Language (HCML) meta-model; and
   defining an Information layer by representing architecture information on the model by describing a mapping association of the defined model and the Hardware Component Modeling Language (HCML) meta-model in an eXtensible Markup Language (XML).

* * * * *